United States Patent [19]

Rieb et al.

[11] Patent Number: 5,692,917
[45] Date of Patent: Dec. 2, 1997

[54] COMPUTER HARDWARE INSERT DEVICE FOR SOFTWARE AUTHORIZATION

[75] Inventors: Sean Michael Rieb; Paul Jay Miller, both of Albuquerque; Kevin Gale Foreman, Sandia Park, all of N. Mex.

[73] Assignee: TRW Inc., Redondo Beach, Calif.

[21] Appl. No.: 631,601

[22] Filed: Apr. 18, 1996

Related U.S. Application Data

[62] Division of Ser. No. 417,506, Apr. 3, 1995, abandoned, which is a continuation of Ser. No. 139,594, Oct. 20, 1993, abandoned, which is a continuation-in-part of Ser. No. 938,111, Aug. 31, 1992, Pat. No. 5,290,191, which is a continuation-in-part of Ser. No. 895,148, Jun. 5, 1992, Pat. No. 5,181,859, which is a continuation of Ser. No. 694,262, Apr. 29, 1991, abandoned.

[51] Int. Cl.$^6$ .................................................. H01R 13/66
[52] U.S. Cl. ........................................... 439/225; 340/543
[58] Field of Search ............................. 439/225, 49, 620, 439/621, 622; 340/500, 543

[56] References Cited

U.S. PATENT DOCUMENTS

| | | |
|---|---|---|
| T947,007 | 6/1976 | Krumreich et al. . |
| 2,073,880 | 3/1937 | Robinson . |
| 2,385,620 | 9/1945 | Fleckenstein . |
| 2,449,150 | 9/1948 | Schnoll . |
| 2,760,128 | 8/1956 | Colby . |
| 2,944,330 | 7/1960 | Swick . |
| 3,072,873 | 1/1963 | Traher . |
| 3,086,188 | 4/1963 | Ross . |
| 3,231,843 | 1/1966 | Antes et al. . |
| 3,234,464 | 2/1966 | Cook . |
| 3,271,726 | 9/1966 | Pfendler . |
| 3,435,387 | 3/1969 | Reinke et al. . |
| 3,500,194 | 3/1970 | Smith . |
| 3,569,915 | 3/1971 | Langham et al. . |
| 3,670,292 | 6/1972 | Tracy . |
| 3,718,859 | 2/1973 | Arlow ................................ 324/72.5 |
| 3,736,379 | 5/1973 | Kagan . |
| 3,740,701 | 6/1973 | Harnden, Jr. . |
| 3,753,261 | 8/1973 | Thaxton . |
| 3,790,858 | 2/1974 | Brancaleone et al. . |
| 3,821,686 | 6/1974 | Harnden, Jr. ............................ 338/21 |
| 3,825,874 | 7/1974 | Peverill . |
| 3,852,700 | 12/1974 | Haws . |
| 3,905,013 | 9/1975 | Lee . |
| 4,002,397 | 1/1977 | Wang et al. . |
| 4,029,386 | 6/1977 | Krantz, Jr. et al. . |

(List continued on next page.)

FOREIGN PATENT DOCUMENTS

| | | |
|---|---|---|
| 0149907 | 7/1985 | European Pat. Off. . |
| 0211508 | 2/1987 | European Pat. Off. . |
| 0348562 | 1/1990 | European Pat. Off. . |
| 8428300 | 2/1985 | Germany . |
| 0246305 | 1/1926 | United Kingdom . |

OTHER PUBLICATIONS

Archer, "Heavy Duty Spike Protector".
Pulse–Guard "Transient Overvoltage Protection", 1 pg, date believed to be Mar. 1992.
Hyatt, "A Technique for Optimizing ESD, EMP and Lightning Protection", pp. 393–408, date believed to be fall 1992.
G&H Technology, Inc., "Pulse–Guard" literature including Sub–Millimeter model, 10 sheets, date believed to be Aug. 1992 (Ex. D).
Pulse–Guard "Pulse–Guard Model 'PGD' Submillimeter Suppressor Arrays", 2 sheets, date believed to be Oct. 1992 (Ex. F).
Pulse–Guard "The Super ESD Suppressor For I/O Connectors", 4 sheets, date believed to be Feb. 1993 (Ex. G).

*Primary Examiner*—Neil Abrams
*Attorney, Agent, or Firm*—Robert W. Keller

[57] ABSTRACT

An insert device provides a conductive path between various pins of a host computer's communication port in order to provide a computer program with the capability of determining the presence of the insert device for software copy protection purposes. The insert device is of a shape, size, and character such that a normal mating engagement between a mated connector pair is unaffected.

7 Claims, 4 Drawing Sheets

U.S. PATENT DOCUMENTS

| | | | |
|---|---|---|---|
| 4,056,299 | 11/1977 | Paige . | |
| 4,082,394 | 4/1978 | Gedney et al. . | |
| 4,089,032 | 5/1978 | Orfano . | |
| 4,326,765 | 4/1982 | Brancaleone . | |
| 4,330,166 | 5/1982 | Cooper et al. . | |
| 4,362,350 | 12/1982 | von Harz . | |
| 4,407,552 | 10/1983 | Watanabe et al. . | |
| 4,415,218 | 11/1983 | McKenzie . | |
| 4,440,463 | 4/1984 | Gliha, Jr. et al. . | |
| 4,522,455 | 6/1985 | Johnson | 439/485 |
| 4,580,866 | 4/1986 | Hagner . | |
| 4,673,237 | 6/1987 | Wadsworth . | |
| 4,676,564 | 6/1987 | Michell, Jr. . | |
| 4,709,253 | 11/1987 | Walters | 357/68 |
| 4,717,349 | 1/1988 | Johnson . | |
| 4,726,638 | 2/1988 | Farrar et al. | 439/620 |
| 4,729,743 | 3/1988 | Farrar et al. | 439/620 |
| 4,729,752 | 3/1988 | Dawson, Jr. et al. | 439/620 |
| 4,813,891 | 3/1989 | Walters et al. . | |
| 4,820,174 | 4/1989 | Farrar et al. . | |
| 4,846,705 | 7/1989 | Brunnenmeyer . | |
| 4,930,200 | 6/1990 | Brush, Jr. et al. . | |
| 4,979,070 | 12/1990 | Bodkin . | |
| 4,979,904 | 12/1990 | Francis . | |
| 4,992,061 | 2/1991 | Brush, Jr. et al. . | |
| 4,992,333 | 2/1991 | Hyatt . | |
| 5,092,788 | 3/1992 | Pristupa, Jr. et al. . | |
| 5,118,302 | 6/1992 | Fussell et al. . | |
| 5,134,252 | 7/1992 | Himeno et al. . | |
| 5,149,274 | 9/1992 | Gallusser et al. . | |
| 5,153,540 | 10/1992 | Gliha, Jr. . | |
| 5,181,859 | 1/1993 | Foreman et al. . | |
| 5,183,698 | 2/1993 | Stephenson et al. | 428/289 |
| 5,257,950 | 11/1993 | Lenker et al. . | |
| 5,290,191 | 3/1994 | Foreman et al. | 439/225 |
| 5,387,131 | 2/1995 | Foreman et al. | 439/620 |
| 5,414,587 | 5/1995 | Kiser et al. | 361/118 |
| 5,428,288 | 6/1995 | Foreman et al. | 439/225 |
| 5,455,734 | 10/1995 | Foreman et al. | 361/118 |

_Fig - 9_

_Fig - 10_

COMPUTER HARDWARE INSERT DEVICE FOR SOFTWARE AUTHORIZATION

CROSS-REFERENCE TO RELATED APPLICATIONS

This is a division of U.S. patent application Ser. No. 08/417,506, filed Apr. 3, 1995 (abandoned), which is a continuation of U.S. patent application Ser. No. 08/139,594, filed Oct. 20, 1993 (abandoned), which is a continuation in part of Ser. No. 07/938,111, filed Aug. 31, 1992, now U.S. Pat. No. 5,290,191, which is a continuation in part of Ser. No. 07/895,148, filed Jun. 5, 1992, now U.S. Pat. No. 5,181,859, which was a continuation of Ser. No. 07/694,262, filed Apr. 29, 1991 (abandoned).

BACKGROUND OF THE INVENTION

1. Technical Field

This invention relates to electrical components, and more particularly, to a device for selectively making electrical connection to a plurality of pins within a computer communication port assembly.

2. Discussion Of The Related Art

In environments employing a wide variety of computers, protection from unauthorized duplication or use of protected software is of the utmost importance. Currently, there exists software and hardware based copy-protection schemes. Existing hardware-based software authorization systems are among the most secure copy-protection schemes and are used with various types of computers (e.g. IBM compatible personal computers, Apple computers, UNIX work stations, etc.). Such systems commonly function in conjunction with various computer communication ports (e.g. SCSI, parallel port, RS-232 serial port, and Apple desk top bus port). Hardware-based systems often employ an authorization module which is mated in series between a computer's communication port and a connector coupled to a peripheral device. Typically, such modules house a printed circuit board containing electronics within a protective casing. Unfortunately, in order to pass and/or modify communication signals between the computer and the peripheral device, such authorization modules require an additional set of connectors located on both sides of the protective casing and which mate with the pre-existing connectors of the communication port and the peripheral device. These additional connectors do not contribute to the functionality of the hardware authorization circuitry located on the printed circuit board. In addition, such authorization modules are bulky due to the large profiles required for housing the printed circuit boards which, in turn, takes up valuable space and unduly increases production and distribution costs.

Thus, it would be desirable to produce a hardware-based software authorization system which functions without requiring an additional set of connectors and does not alter the normal mating engagement between the pre-existing connector pairs. Further, it would be desirable to produce such a system without requiring a large protective enclosure for the authorization circuitry which, in turn, would save space and reduce production and distribution costs.

SUMMARY OF THE INVENTION

Pursuant to the present invention, an authorization insert device capable of interfacing with the standard unmodified pre-existing connector pairs of a communication port assembly of a computer and a peripheral device is disclosed. The communication port assembly includes a plurality of pins and corresponding sockets which, when mated, pass signals between the computer and the peripheral device. The insert device is disposed in the readily accessible gap between the computer's standard communication port and a standard connector coupled to the peripheral device. Once installed, the insert device can provide computer software with sufficient information to determine whether it is present, e.g. by interrogating the pins. If not, access to certain pieces of software can be denied. Also, the insert device is virtually non-intrusive; there is no observable change in the mechanical configuration of the communication port assembly. The insert device can be totally passive; in order to function, it requires no batteries or electrical power. However, the insert device can obtain power from the pins if desirable for a specific application.

In accordance with the present invention, the insert device includes a substrate having holes aligned with the communication port assembly's pins such that the device may be removably inserted onto the pins. When the pins extend through the holes in the substrate, electrically conductive bendable fingers, affixed to the substrate, contact one or more of the pins. Depending upon a specific application, one or more of the conductive bendable fingers are interconnected by an electrical conductor pattern formed on one of the substrate's surfaces. When installed, the insert device provides a conductive path between at least two of the pins such that a software program of the host computer is capable of determining the presence of the device in order to limit or deny unauthorized access to the host computer's protected software when the device is not disposed onto the pins.

In the preferred embodiments of the present invention, the insert device further includes active electronic components on the substrate which receive power from the pins of the communication port assembly.

BRIEF DESCRIPTION OF THE DRAWINGS

The various advantages of the present invention will become apparent to those skilled in the art after reading the following specifications and by reference to the drawings in which.

DETAILED DESCRIPTION OF THE PREFERRED EMBODIMENTS

The following description of the preferred embodiments is merely exemplary in nature and is in no way intended to limit the invention or its application or uses. Additional embodiments will also come to mind by reference to the aforementioned U.S. Pat. No. 5,290,191 to Foreman et al, which is hereby incorporated by reference.

The present invention discloses an authorization insert device which is inserted between a computer's communication port and a peripheral device's cable connector, together forming a communication port assembly, for providing software copy protection for the host computer. The communication port assembly includes a plurality of pins and corresponding sockets which when mated, pass signals between the host computer and the peripheral device. When inserted onto the pins, the insert device provides a conductive path and/or electronic circuitry between two or more of the pins. Thus, when a computer program of the host computer interrogates the communication port, it determines if the conductive path and/or the electronic circuitry provided by the insert device is present. Therefore, the program will deny access to, allow partial access to, or limit the duration of access to the host computer's protected software unless the insert device is disposed on the pins.

Figure 1:
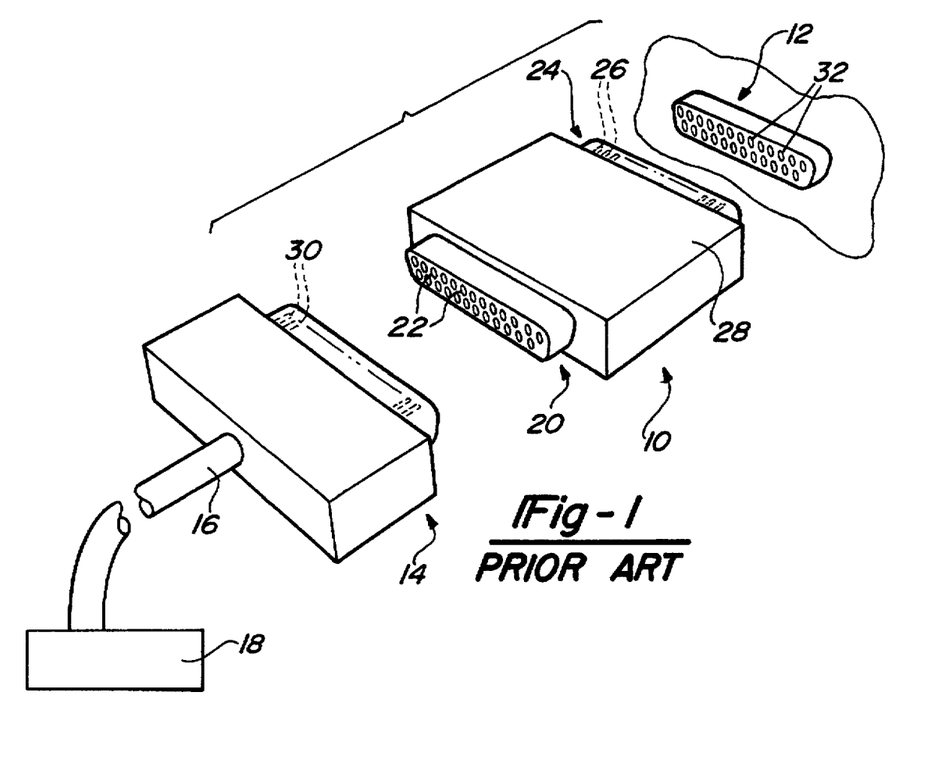
FIG. 1 is an exploded isometric view of a Prior Art authorization module disposed between a female computer communication port and a male cable connector which is coupled to a peripheral device.

FIG. 1 is an exploded isometric view of a typical Prior Art authorization module 10 positioned in series between female computer communication port 12 and male cable connector 14 which is coupled by cable 16 to peripheral device 18 such as, but not limited to, a printer, disk drive or the like. Authorization module 10 includes female connector 20 with sockets 22 and male connector 24 with pins 26. A printed circuit board with authorization circuitry is located between connectors 20 and 24 and is enclosed by protective casing 28. Signals are passed between port 12 and device 18 when sockets 22 are mated with pins 30 of connector 14 and pins 26 are mated with sockets 32 of port 12.

Figure 2:
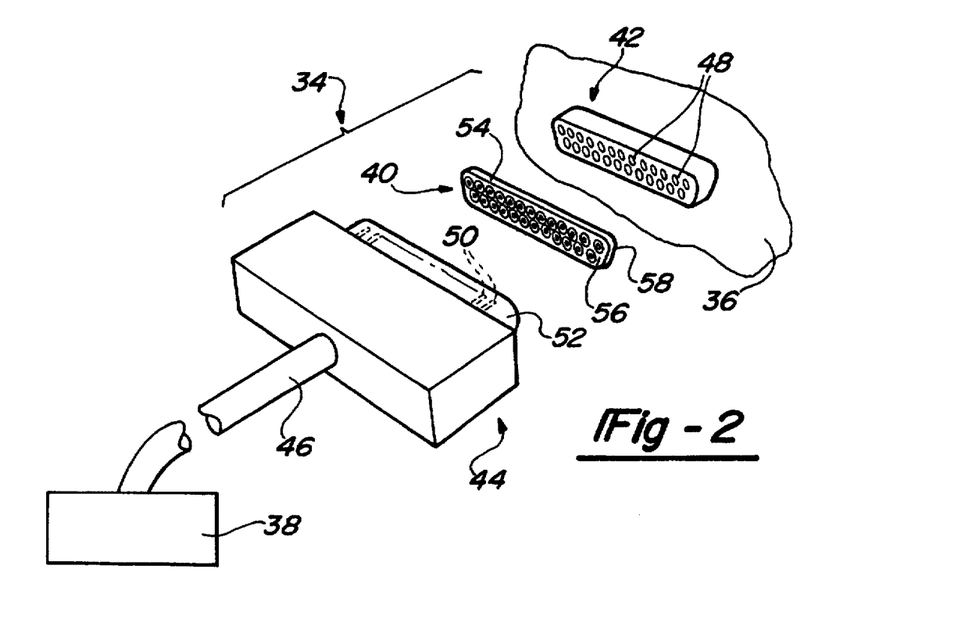
FIG. 2 is an exploded isometric view of the authorization insert device positioned between a standard parallel communication port of a host computer and a male cable connector coupled to a peripheral device, in accordance with the present invention.

FIG. 2 is an exploded isometric view of communication port assembly 34 for host computer 36 and peripheral device 38 such as, but not limited to, a disk drive or the like. Communication port assembly 34 includes parallel communication port 42 and male cable connector 44. Connector 44 is coupled by cable 46 to peripheral device 38. Parallel communication port 42 includes female pin sockets 48, and male cable connector 44 includes pins 50 which are surrounded by metal shield 52. Authorization insert device 40 is designed to fit unobtrusively between port 42 and connector 44 so that it can be easily inserted and removed without disturbing the normal positive connection between the port and the connector. Insert device 40 includes substrate 54 having opposing major surfaces 56 and 58. Substrate 54 is a dielectric printed circuit board formed from FR-4 circuit board material but also can be formed from semi-conductor or any other suitable material for use in electronic applications.

Figure 3:
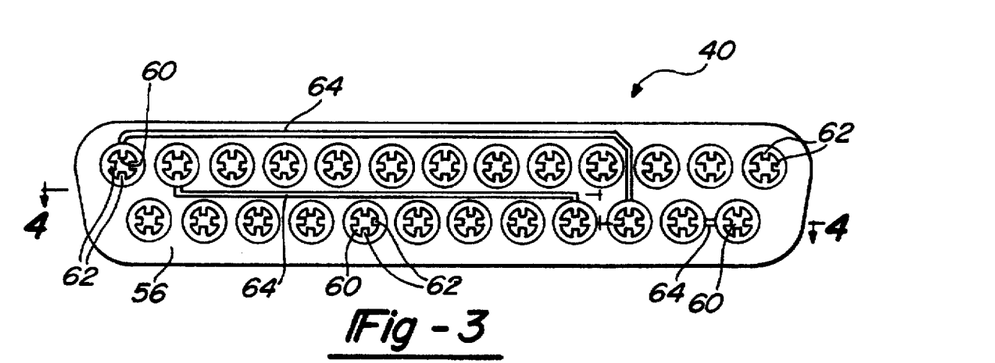
FIG. 3 is an end view of the authorization insert device of FIG. 2 in accordance with the present invention.

FIG. 3 is an end view of authorization insert device 40 including pin holes 60, extending from major surface 56 through to major surface 58, for receiving pins 50. As is apparent to one skilled in the art, pin holes 60 are aligned and shaped such that pins 50 extend through insert device 40 when male cable connector 44 is mated with parallel communication port 42. It should be noted that the number and configuration of pin holes 60 are used by way of example and may be varied according to a specific application while remaining within the scope of the present invention. Electrically conductive bendable fingers 62, affixed to major surface 56, extend partially into pin holes 60 for making contact with pins 50. As pins 50 extend through respective holes 60, fingers 62 bend under the force of pins 50 being inserted through holes 60 thereby providing a sliding, removable, yet positive electrical connection with each respective pin. The amount, shape, and size of pin contacts can be varied while remaining within the scope of the present invention. For example, the walls of the holes 60 can be plated with conductive material for contacting pins 50. In addition, one or more of pins 50 can be electrically isolated from insert device 40 through the absence of placing conductive bendable fingers around a corresponding hole within substrate 54. Some of the fingers 62 are interconnected by way of electrical conductor pattern 64 formed on surface 56 of substrate 54. Electrical conductor pattern 64 is formed from a conductive material such as, but not limited to, beryllium copper alloy.

Figure 4:
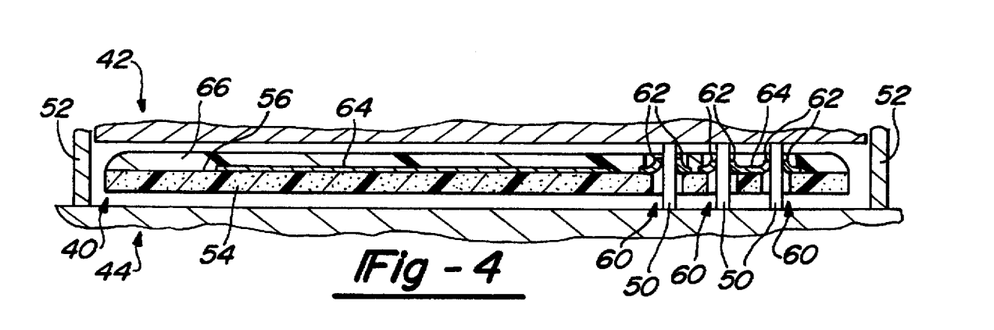
FIG. 4 is a cross-sectional view, taken along lines 4—4 of FIG. 3, in accordance with the present invention.

FIG. 4 is a cross-sectional view, taken along lines 4—4 of FIG. 3, illustrating authorization insert device 40 inserted between mated male cable connector 44 and parallel communication port 42. Authorization insert device 40 is sufficiently thin so as to fit between male cable connector 44 and parallel communication port 42 while permitting substantially normal mating engagement therebetween. Also, the perimeter of substrate 54 is smaller than the inner perimeter of metal shield 52. Major surface 56 of substrate 54 is covered with insulating layer 66 formed from, but not limited to, DuPont electronic conformal coating.

Figure 5:
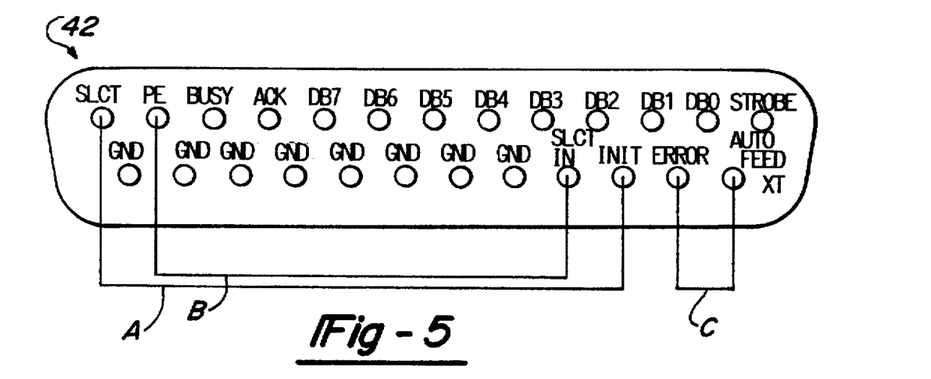
FIG. 5 is an electrical schematic diagram of the exemplary conductive paths, provided by the authorization insert device, between the various sockets of the standard parallel communication port of FIG. 2.

FIG. 5 is an electrical schematic diagram of parallel communication port 42 illustrating electrically conductive paths A, B, and C provided by authorization insert device 40 when positioned between mated pins 50 and female pin sockets 48. These conductive paths correspond to the conductive paths between some of the pins 50 and, in turn, the fingers 62 which are interconnected by electrical conductor pattern 64. Parallel communication port 42 is a standard parallel communication port for personal computers, and since the pin outs are well known, they need not be described in detail herein. Conductive paths A, B, and C provide a suitable software routine in a program stored in host computer 36 with a means for, when interrogating mated pins 50 and sockets 48, determining the presence of the authorization insert device 40 between the mated connectors. Therefore, when the conductive paths on insert device 40 are not present, the program has the option of, but is not limited to, limiting or denying access to the protected software of host computer 36. A nonlimiting example of a suitable software routine is the following C language program for a standard parallel communication port:

TABLE 1

```
#include <stdio.h>
#include <dos.h>
#include <time.h>
#include "compat.h"
#define lpt1_cntl(x) (outp(*peekad+2,x))
#define lpt1_stat (inp(*peekad+1)&0xb8)
#define port_test(x) lpt1_cntl((x<<1) & 0xe)
#define port_result ((lpt1_stat >> 3)& 0x7 ^ 0x5)
```

TABLE 1-continued

```
unsigned far *peekad;
main( )
{
    int i;
    peekad = (unsigned far *)MK_FP(0x40,8);
    if (*peekad == 0) {
        printf("ERROR - no LPT1\n");
        return 1;
    }
    for (i=0; i < 8; i++) {
        port_test(i);
        if (i !=port_result) {
            printf("ERROR - Key not found\n");
            lpt1_cntl(0);
            return 1;
        }
    }
    lpt1_cntl(0);
    printf("Key found\n");
    return 0;
}
```

As will be apparent to one skilled in the art, this routine sets and measures the voltages at some of the pins 50 in order to determine if conductive paths A, B, and C are present, i.e. whether the pins 50 in electrical contact with paths A, B, and C are shorted, indicating the presence of insert device 40.

Figure 6:
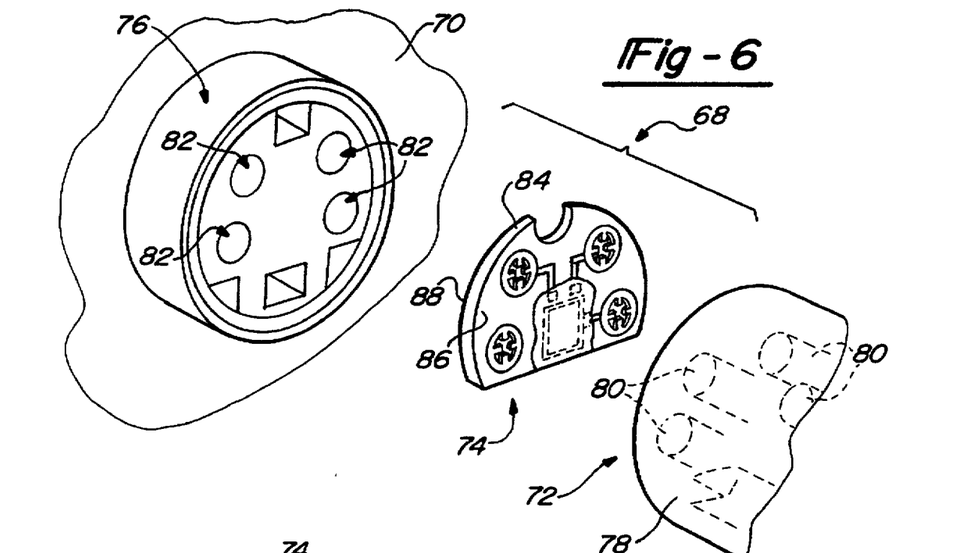
FIG. 6 is an exploded isometric view of a preferred embodiment of the authorization insert device positioned between an Apple Desk Top Bus Port of a host computer and a corresponding male connector in accordance with the present invention.

FIG. 6 is an exploded isometric view of a standard unmodified communication port assembly 68 for an Apple computer 70 and a peripheral device, similar to peripheral device 38 of FIG. 2, coupled to male cable connector 72. Authorization insert device 74 has many of the same attributes as the previous embodiment. Namely, it is configured to fit unobtrusively between Apple Desk Top Bus Port 76 and connector 72 so that it can be easily inserted and removed without disturbing the normal positive connection between the port and the connector. Connector 72 includes metal shield 78 which surrounds pins 80, and Apple Desk Top Bus Port 76 includes pin sockets 82. Insert device 74 includes substrate 84 having opposing major surfaces 86 and 88. Substrate 84 is a dielectric printed circuit board formed from FR-4 circuit board material but also can be formed from semi-conductor or any other suitable material for use in electronic applications.

Figure 7:
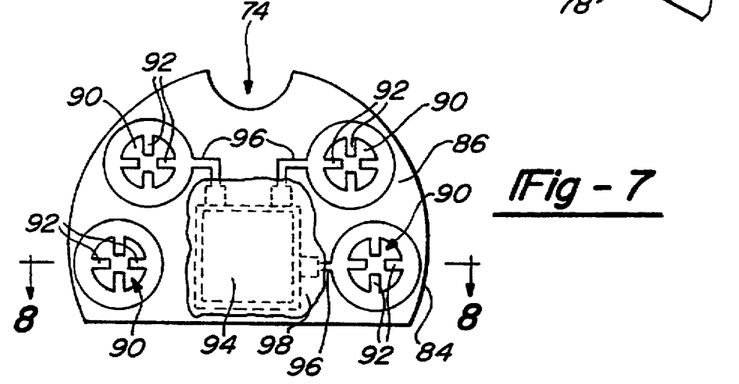
FIG. 7 is an end view of the authorization insert device of FIG. 6 in accordance with the present invention.

FIG. 7 is an end view of authorization insert device 74 including pin holes 90, extending from major surface 86 through to major surface 88, for receiving pins 80. As is apparent to one skilled in the art, pin holes 90 are aligned and shaped such that pins 80 extend through insert device 74 when male connector 72 is mated with a standard Apple Desk Top Bus Port 76. It should be noted that the number and configuration of the holes within insert device 74 are used by way of example and may be varied according to a specific application while remaining within the scope of the present invention. Electrically conductive bendable fingers 92, affixed to major surface 86, extend partially into pin holes 90 for making contact with connector pins 80 when insert device 74 is inserted onto male connector 72. As pins 80 extend through holes 90, fingers 92 bend under the force of pins 80 being inserted through holes 90 thereby providing a sliding, removable, yet positive electrical connection with each respective pin. As noted above, the amount, shape, and size of the pin contacts can be varied while remaining within the scope of the present invention. In addition, one or more of pins 80 can be electrically isolated from authorization insert device 74 through the absence of placing conductive bendable fingers around a corresponding hole within substrate 84. In accordance with a preferred embodiment, active electronic integrated circuit component 94 is positioned within substrate 84 and is coupled to some of fingers 92 by electrical conductor pattern 96. Component 94 is substantially covered by insulating layer 98 such as, but not limited to, DuPont electronic conformal coating or the like. It should be noted that component 94 can be replaced or supplemented with various passive electronic components while remaining within the scope of the present invention.

Figure 8:
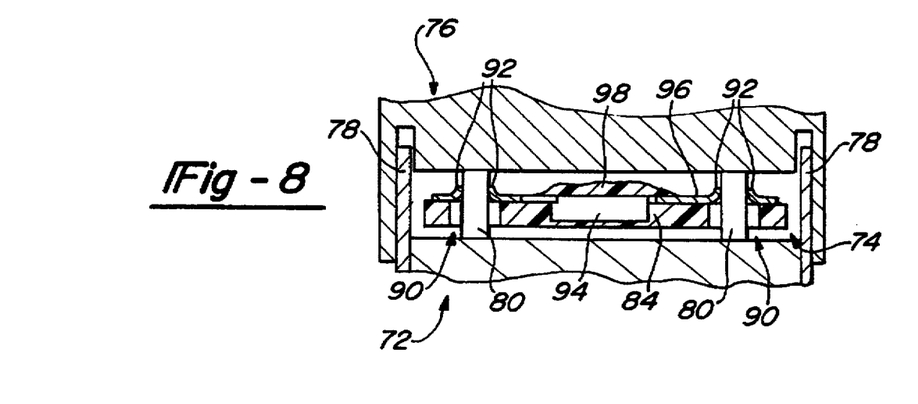
FIG. 8 is a cross-sectional view, taken along lines 8—8 of FIG. 7, in accordance with the present invention.

FIG. 8 is a cross-sectional view, taken along lines 8—8 of FIG. 7, illustrating authorization insert device 74 inserted between mated male connector 72 and Apple Desk Top Bus Port 76. Insert device 74 is sufficiently thin so as to fit between male connector 72 and Apple Desk Top Bus Port 76 while permitting substantially normal mating engagement therebetween. Also, the perimeter of substrate 84 is smaller than the inner perimeter of metal shield 78. Component 94 receives power from and communicates with host computer 70 along mated pins 80 and female pin sockets 82 by way of fingers 92 and electrical conductor pattern 96. Communication between component 94 and host computer 70 provides a suitable software routine in a program stored in host computer 70 with a means for, when interrogating mated pins 80 and sockets 82, determining the presence of the insert device 74 between the mated connectors. As in the previous embodiment, this allows the program to control the amount of access to the host computer's protected software.

Figure 9:
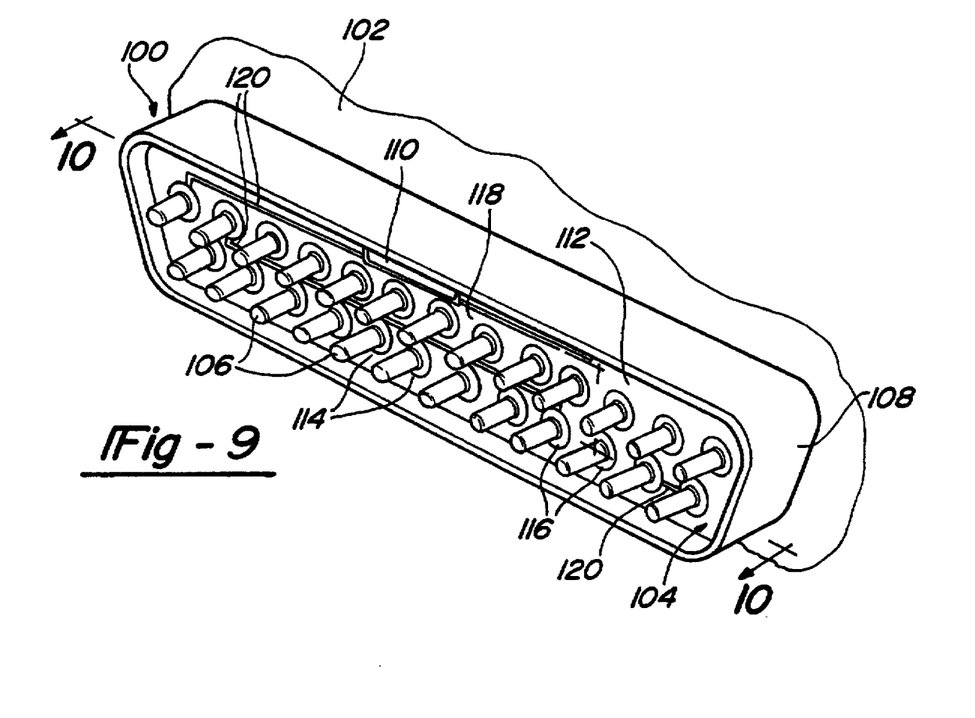
FIG. 9 is an isometric view of another preferred embodiment of the authorization insert device positioned upon a standard serial communication port of a host computer in accordance with the present invention.

FIG. 9 is an isometric view of a standard unmodified serial communication port 100 for host computer 102. Authorization insert device 104 is substantially the same as authorization insert device 40 of FIGS. 2–4 with the addition of active electronic integrated circuit component 110 within substrate 112. Insert device 104 includes pin holes 114 for receiving pins 106 which are surrounded by metal shield 108. As is apparent to one skilled in the art, pin holes 114 are aligned and shaped such that pins 106 extend through insert device 104 when inserted within serial port 100. Electrically conductive bendable fingers 116, affixed to major surface 118, extend partially into pin holes 114 for making contact with pins 106 when insert device 104 is inserted within port 100. As pins 106 extend through holes 114, fingers 116 bend under the force of pins 106 being inserted through holes 114 thereby providing a sliding, removable, yet positive electrical connection with each respective pin. As noted above, the amount, shape, and size of the pin contacts can be varied while remaining within the scope of the present invention. In accordance with a preferred embodiment, component 110 is coupled to some of fingers 116 by way of electrical conductor pattern 120. As with the previous embodiment, some of fingers 116 are interconnected by way of pattern 120. Substrate 112 is substantially covered by insulating layer 122 such as, but not limited to, DuPont electronic conformal coating or the like.

Figure 10:
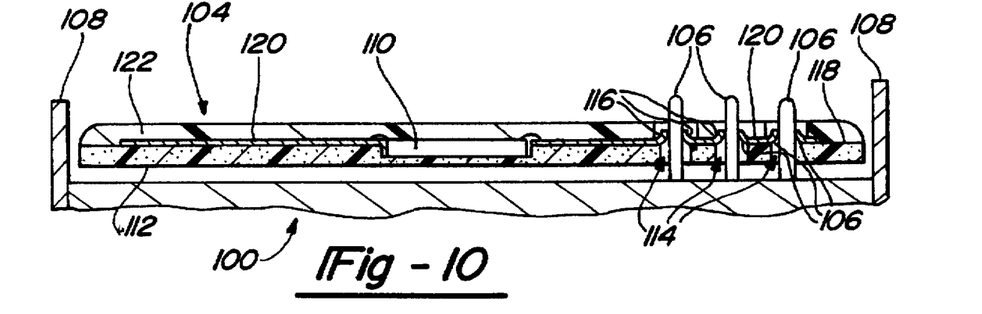
FIG. 10 is a cross-sectional view taken along lines 10—10 of FIG. 9 in accordance with the present invention.

FIG. 10 is a cross-sectional view, taken along lines 10—10 of FIG. 9, illustrating authorization insert device 104 positioned upon pins 106 of port 100. The perimeter of substrate 112 is smaller than the perimeter of metal shield 108. Component 110 receives power from and communicates with host computer 102 along pins 106 by way of fingers 116 and electrical conductor pattern 120. In this embodiment, insert device 104 does not require a mated connector pair to communicate with host computer 102. As with the previous embodiments, communication between component 110 and computer 102 or the presence of conductive paths between some of the pins 106 provide a suitable software routine in a program stored in host computer 102, when interrogating pins 106, with a means for determining the presence of insert device 104.

From the foregoing it can be seen that the use of the authorization insert devices for providing a computer with a software copy protection scheme has several useful consequences. Compared to prior art hardware based copy protection devices, the use of the authorization insert device requires minimal mechanical intrusion, eliminates the need for extraneous hardware, does not affect the normal mating engagement between pre-existing connectors, and is functional without a mated connector pair. Use of the authorization insert device is also advantageous in that it reduces production and distribution costs. For example, the authorization insert device is small enough to be mailed in an envelope or on a post card. Of course, the teachings of the present invention can be employed to produce an authorization insert device which provides additional and different electronic functions for various types of computers, and the authorization insert devices can be made with variations in the materials used.

The foregoing discussion discloses and describes merely exemplary embodiments of the present invention. One skilled in the art will readily recognize from such discussion, and from the accompanying drawings and claims, that various changes, modifications, and variations can be made therein without departing from the spirit and scope of the present invention as defined by the following claims.

What is claimed is:

1. A method of providing a computer with a means for selectively providing access to protected software of the computer, the computer including a communication port connector with a plurality of pins which when mated with corresponding sockets of a peripheral device connector pass signals between the computer and the peripheral device, said method comprising the steps of:

storing a test program in the computer;

providing a substrate having a series of holes therein corresponding to said plurality of pins;

providing a conductive path on said substrate between two selected holes of said series of holes;

inserting said substrate onto said plurality of pins of the communication port connector, with said plurality of pins extending through the series of holes in the substrate and with two of said plurality of pins making electrical connection with said conductive path;

mating, in a normal fashion, the peripheral device connector directly with the communication port connector while leaving the substrate sandwiched therebetween;

interrogating said two pins with the test program by applying and measuring voltages on said two pins to determine whether said conductive path is present; and allowing access to said protected software if said conductive path is present.

2. The method of claim 1 wherein the step of interrogating said two pins includes the steps of:

applying a voltage to a first of said two pins extending through said two selected holes; and measuring the voltage at a second of said two pins to determine if said conductive path is present between said two pins.

3. A method of providing software authorization for a computer including a communication port connector with a plurality of pins that are electrically isolated from one another, the method comprising the steps of:

providing an authorization device in the form of a thin, flat substrate having a plurality of holes therein corresponding with the pins in the communication port connector, said substrate further including first and second contact means surrounding first and second holes in the substrate, said substrate further including a conductive path between the first and second contact means;

inserting the authorization device into the communication port connector so that the pins thereof protrude through the holes in the substrate and electrical connection is made between first and second pins via the first and second electrical contact means and the conductive path therebetween;

mating in a normal fashion, a peripheral device connector directly with the communication port connector while leaving the authorization device sandwiched therebetween;

storing a software routine in the computer for selectively providing access to protected software stored within the computer, the software routine performing the steps of:

(a) applying a voltage to the first pin of the plurality of pins of the communication port;

(b) measuring the voltage on the second pin of the plurality of pins to determine if a conductive path is present between the first and second pins;

(c) limiting or denying unauthorized access to the protected software if the conductive path is not present between the first and second pins; and (d) allowing access to the protected software if the conductive path is present between the first and second pins.

4. A method of selectively providing access to a given program stored within a computer, the computer including at least one port connector having a plurality of terminals therein, the method comprising the steps of:

storing a test program in the computer;

placing an authorization device over the plurality of terminals in the port, said authorization device including a conductive path for shorting together two of the plurality of terminals;

mating, in a normal fashion, a second connector with the port connector while leaving the authorization device sandwiched therebetween;

running the test program to determine whether a user can obtain access to the given program, the test program performing the steps of:

(a) applying a voltage to a first terminal of the two terminals;

(b) measuring the voltage on a second terminal of the two terminals to determine whether the second terminal is at substantially the same voltage level as the first terminal due to the presence of the conductive path provided by way of the authorization device;

(c) denying access to the given program if the voltage on the second terminal is not at substantially the same voltage level as the first terminal due to the absence of the authorization device; and (d) allowing access to the given program if the voltage on the second terminal is at substantially the same voltage level as the first terminal.

5. The method of claim 4 wherein the authorization device is in the form of a thin substrate having a plurality of holes therein aligned with the plurality of terminals, and wherein the method further comprises:

inserting the substrate over the plurality of terminals such that the plurality terminals extend through the holes;

contacting the first terminal with an end of the conductive path as the first terminal extends through one of the plurality of holes; and contacting the second terminal of the plurality of terminals with an opposite end of the conductive path as the second terminal extends through another one of the plurality of holes.

6. A method of providing a computer with a means for limiting or denying unauthorized access to protected software stored within the computer, the computer including a communication port with a plurality of sockets which when mated with corresponding pins of a peripheral device pass signals between the computer and the peripheral device, the method comprising the steps of:

storing a software routine in the computer for setting and measuring voltages on selected mated pins of the plurality of pins;

providing a substrate having a series of holes therein corresponding to the pins;

providing at least one conductive path on the substrate between selected holes of the series of holes;

inserting the substrate onto the pins with the pins extending through the series of holes and making electrical connection with the at least one conductive path;

mating, in a normal manner, the pins of the peripheral device with the plurality of sockets of the communication port while leaving the substrate sandwiched therebetween;

interrogating the selected mated pins with the software routine to determine whether the at least one conductive path is present between the selected mated pins;

limiting or denying unauthorized access to the protected software if the at least one conductive path is not present between the selected mated pins; and allowing access to the protected software if the at least one conductive path is present between the selected mated pins.

7. The method of claim 6 wherein the step of interrogating the selected mated pins includes the steps of:

applying a voltage to a first of the selected mated pins; and measuring the voltage on a second of the selected mated pins to determine if the at least one conductive path is present between the first and second selected mated pins.

* * * * *